United States Patent [19]

Strong

[11] Patent Number: 5,407,068
[45] Date of Patent: Apr. 18, 1995

[54] METHOD AND APPARATUS FOR TRANSPORTING TEST BOARDS

[76] Inventor: Leslie G. Strong, 240 Mississippi Dr., Monticello, Minn. 55362

[21] Appl. No.: 3,579

[22] Filed: Jan. 13, 1993

Related U.S. Application Data

[63] Continuation-in-part of Ser. No. 781,105, Oct. 22, 1991, Pat. No. 5,203,454.

[51] Int. Cl.⁶ .................................................. B65D 73/02
[52] U.S. Cl. ...................................... 206/328; 206/334; 206/560; 206/565; 53/473
[58] Field of Search ................ 206/328, 334, 560, 564, 206/565, 454; 53/473

[56] References Cited

U.S. PATENT DOCUMENTS

| | | |
|---|---|---|
| 1,101,315 | 6/1914 | Metzgar . |
| 1,169,845 | 2/1916 | McAllaster . |
| 1,261,937 | 4/1918 | Jambor . |
| 1,492,113 | 4/1924 | Welsh . |
| 1,817,913 | 8/1931 | Bellemere . |
| 2,811,251 | 10/1957 | Yerkovich ..................... 206/565 X |
| 3,102,728 | 9/1963 | Booth . |
| 3,823,350 | 7/1974 | Stoner . |
| 3,892,309 | 7/1975 | Coffey et al. . |
| 3,892,312 | 7/1975 | Tems ................................ 206/328 |
| 4,069,496 | 1/1978 | Kowalski ..................... 206/328 X |
| 4,083,453 | 4/1978 | Berger et al. . |
| 4,171,049 | 10/1979 | Nohara et al. . |
| 4,245,753 | 1/1981 | Ellis . |
| 4,285,557 | 8/1981 | Paladino et al. . |
| 4,379,505 | 4/1983 | Alemanni . |
| 4,489,830 | 12/1984 | Charlebois et al. . |
| 4,535,887 | 8/1985 | Egawa . |
| 4,564,880 | 1/1986 | Christ et al. . |
| 4,572,371 | 2/1986 | Asenbauer . |
| 4,615,441 | 10/1986 | Nakamura . |
| 4,681,221 | 7/1987 | Chickanosky et al. . |
| 4,760,478 | 7/1988 | Pal et al. . |
| 4,853,811 | 8/1989 | Brooks, Jr. et al. . |
| 4,881,639 | 11/1989 | Matsuoka et al. . |
| 4,901,853 | 2/1990 | Maryatt . |
| 4,936,783 | 6/1990 | Petersen . |
| 4,940,143 | 7/1990 | Stanfield . |
| 5,000,697 | 3/1991 | Murphy . |
| 5,012,925 | 5/1991 | Gallagher, Sr. . |
| 5,045,173 | 9/1991 | Guadagno et al. ............. 206/454 X |
| 5,103,976 | 4/1992 | Murphy . |
| 5,203,454 | 4/1993 | Strong ................................ 206/328 |

FOREIGN PATENT DOCUMENTS

WO88/00161  1/1988  WIPO .

OTHER PUBLICATIONS

IBM Technical Disclosure Bulletin, vol. 21, No. 1 (Jun. 1978).

*Primary Examiner*—Bryon P. Gehman
*Attorney, Agent, or Firm*—Schwegman, Lundberg & Woessner

[57] ABSTRACT

A method and apparatus for packaging test boards during transport and handling is disclosed. The apparatus is a tray having an outer wall and a bottom surface which at least partially define a protected space; and retaining clips for releasably retaining at least one test board in the protected space. In use, a test board is forced between the clip and bottom surface of the tray, where it is retained through friction.

12 Claims, 3 Drawing Sheets

METHOD AND APPARATUS FOR TRANSPORTING TEST BOARDS

This application is a continuation-in-part of U.S. patent application Ser. No. 07/781,105, filed on Oct. 22, 1991, now U.S. Pat. No. 5,603,954, which is hereby incorporated by reference.

FIELD OF THE INVENTION

This invention relates generally to the field of packaging and transporting sensitive electronic components known as test boards. More particularly, the invention relates to an improved container for packaging test boards during assembly and transport.

DESCRIPTION OF THE RELATED ART

As the personal computer market continues to mature, manufacturers are increasingly searching for areas in which manufacturing costs can be lowered to provide the least expensive product for an increasingly demanding marketplace. The manufacturing of hard disk drives is one of those areas in which manufacturers are continuing to make progress in providing lower cost components for personal computers.

One component used in hard disk drives is a suspension assembly which holds the transducer head used to load and One component used in hard disk drives is a suspension assembly which holds the transducer head used to load and retrieve electronic data off the storage media. The suspension assembly is used to suspend the transducer head above the media. A more detailed discussion of the functions of the suspension assembly is contained in U.S. patent application Ser. No. 07/781,105, referred to above.

One step in the manufacturing process of a hard disk drive is the attachment of a test board to the transducer head after it has been mounted on the suspension assembly. The test board is attached to the transducer head by fine wire leads and is used to ensure that the transducer head is functioning properly before the suspension assembly and transducer head are mounted on the hard disk drive frame. By testing before assembly, defective products can be taken out of the manufacturing process earlier, thereby reducing waste and lost productivity.

At the present time, test boards are transported in formed cardboard trays. The test boards are attached to the bottom of the trays using adhesive provided on the bottom of the trays. Once the test boards are in place, fine wire leads are soldered to the test boards. Foam is then placed over the fine wire leads to retain them within the tray and a cardboard cover is then stapled to the top of the tray.

The method of transporting test boards as described above presents many problems for manufacturers. First and foremost, the present method injects many sources of contamination into the manufacturing process.

The cardboard is a major source of loose fibers which become embedded on the test boards and along the fine wire leads.

The adhesive used to retain the test boards on the bottom surface of the cardboard tray also does not fully release from the test boards when they are removed from the tray, thereby contaminating the test boards with adhesive. In addition, the adhesive attracts and collects additional contamination as other particles contact the adhesive retained on the test boards.

The process of stapling a cardboard cover on the top of the tray also induces contamination of the test boards and fine wire leads. In particular, the stapling displaces and releases a significant amount of loose fibers which are then free to contaminate the test boards and fine wire leads.

It is clear that there exists a need in the art for an improved method and apparatus for packaging test boards used with suspension assemblies.

SUMMARY OF THE INVENTION

The present invention provides a method and apparatus for packaging test boards during transport and handling which eliminates the sources of contamination endemic to the known methods of transporting test boards. The preferred trays manufactured according to the present invention provide a secure and clean environment for the attachment of the fine wire leads to the test boards and transportation of the test boards to the area in which suspension assemblies are tested.

The apparatus for transporting test boards according to the present invention comprises a tray having an outer wall and a bottom surface which at least partially define a protected space; and retaining clips for releasably retaining at least one test board in said protected space.

As provided in the preferred embodiments, the tray is formed of a non-contaminating material, such as plastic or metal. The tray preferably includes a plurality of retaining clips, each retaining clip designed to hold at least one test board within the tray during both attachment of the fine wire leads as well as transport and shipping of the trays of test boards to the testing site.

In the preferred embodiment, the test board trays are preferably stackable, with the bottom wall of each tray forming a lid for the tray beneath it. In that way, the need for fasteners to provide a cover to the trays is eliminated, along with that additional source of possible source of contamination.

The preferred retaining clips for retaining test boards within the preferred trays comprises a clip molded unitary with and above the bottom surface of the tray. In use, a test board is loaded between the each retaining clip and the bottom wall, with the retaining clip forcing the test board against the bottom wall to retain it within the tray.

These and other various features and advantages which characterize the invention are pointed out with particularity in the claims annexed hereto and forming a part hereof. However, for a better understanding of the invention and its advantages, reference should be made to the drawings which form a further part hereof, and to the accompanying descriptive matter, in which there is illustrated and described preferred embodiments of the invention.

DETAILED DESCRIPTION OF THE PREFERRED EMBODIMENTS

Figure 1A:
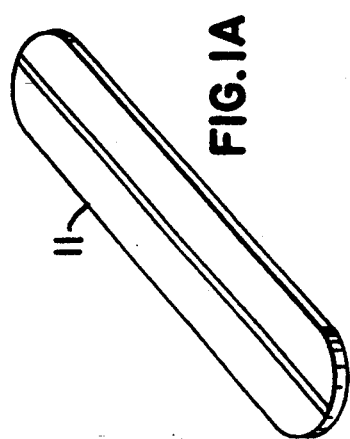
FIG. 1A is a perspective view of a test board without wire leads.

Referring now to the Drawings, wherein like reference numerals designate corresponding structure throughout the views, the container 10 constructed according to one preferred embodiment of the invention includes a bottom wall 14 surrounded by side walls 12.

Bottom wall 14 has, formed in it, a series of recesses 16, with each recess 16 adapted to receive a test board. The recesses 16 are used to prevent transverse movement of the test boards once trapped under a retaining clip 20.

It is preferred that the recesses 16 be formed in rows so that a channel 18 can be formed across each row of recesses 16. Slot 18 is used to provide access by a tweezer or other implement to remove test boards from the tray 10.

A retaining clip 20 is preferably formed integral with the tray 10 and has one end resiliently suspended above a recess 16. Retaining clip 20 is designed to grip and retain a test board in each of the recesses 16 by exerting a force downward towards the bottom surface of the tray 10. That force results in friction between the tray 10, test board 11 and retaining clip 20, all of which combine to retain the test board 11 in place.

FIG. 1A depicts one version of a test board 11 for use in the tray 10 of the present invention. As shown there, the test board 11 has a substantially oval shape, although the actual test boards used with the trays 10 of the present invention can be oval, rectangular or have any other necessary shape.

Figure 1:
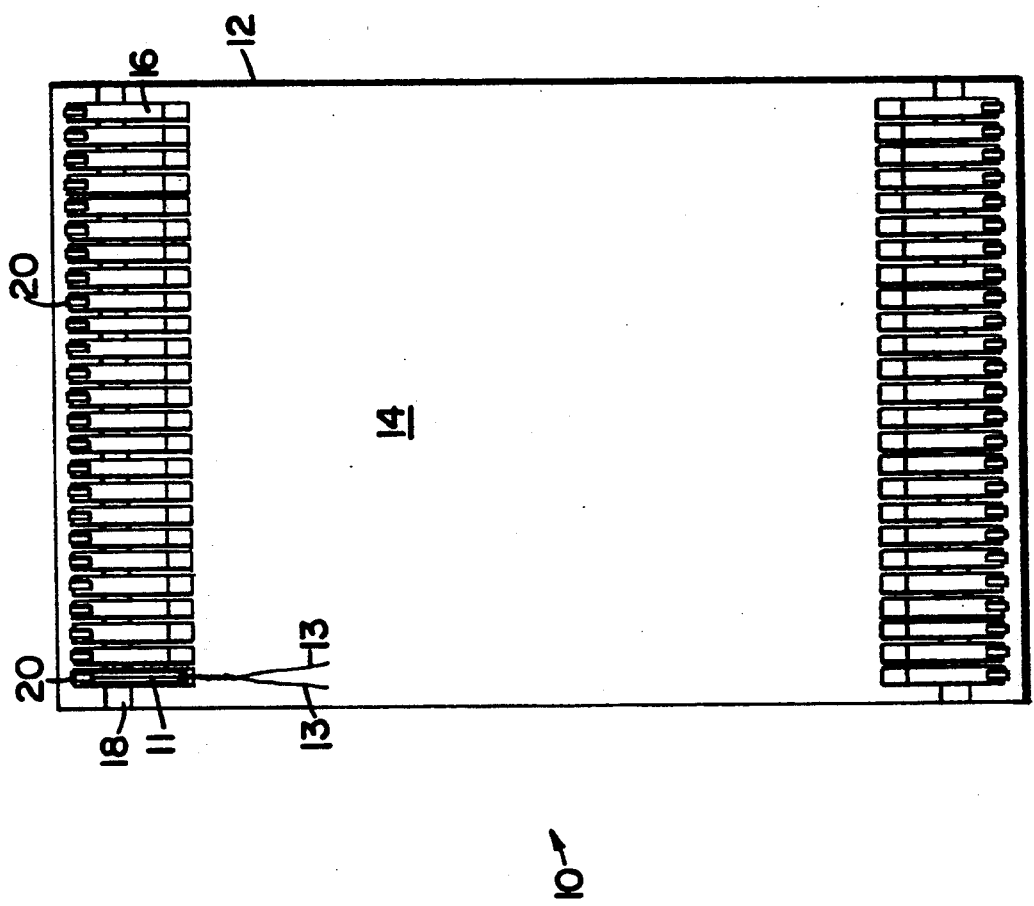
FIG. 1 is a plan view of one preferred embodiment of a tray according to the present invention.
Figure 1B:
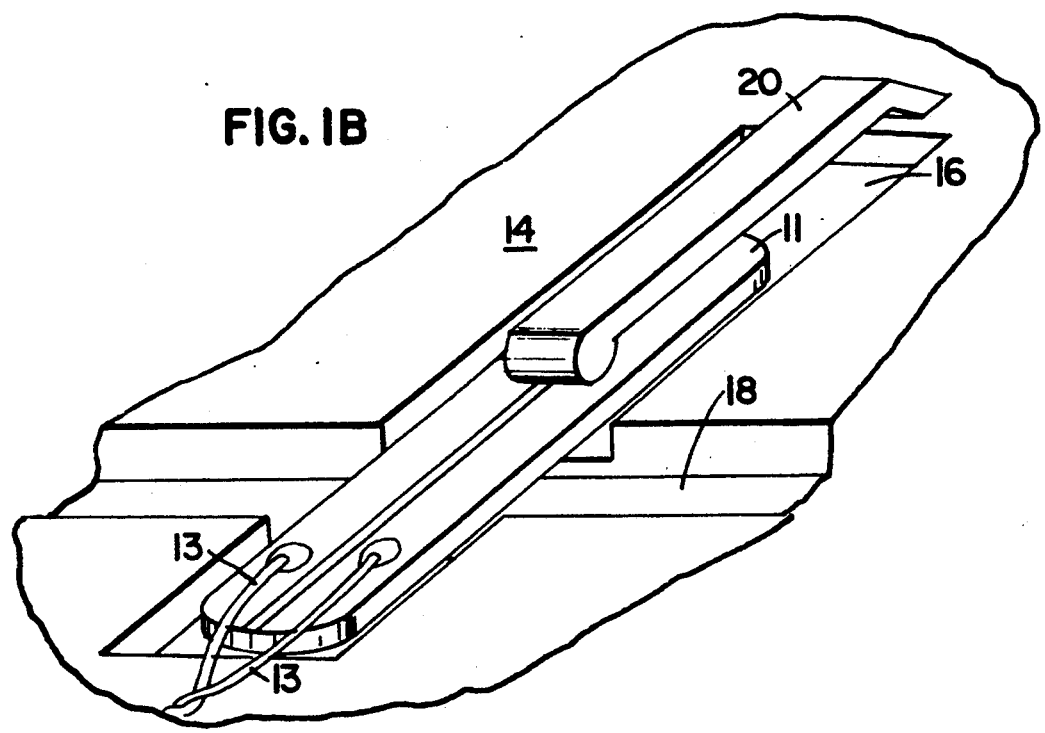
FIG. 1B is an enlarged partial perspective view of one preferred embodiment of the retaining clip according to the present invention, with a test board retained by the clip.

FIG. 1B depicts an enlarged partial view of one preferred retaining clip 20 and recess 16 according to the present invention, in which a test board 11 is retained. Test board 11 is depicted with a pair of fine wire leads 13 attached to its upper surface. Also depicted is channel 18 which extends under the retained test board 11. As such, it can be seen that channel 18 provides a means for removing the test board 11 from the tray 10 using a tweezer or other device.

Figure 2:
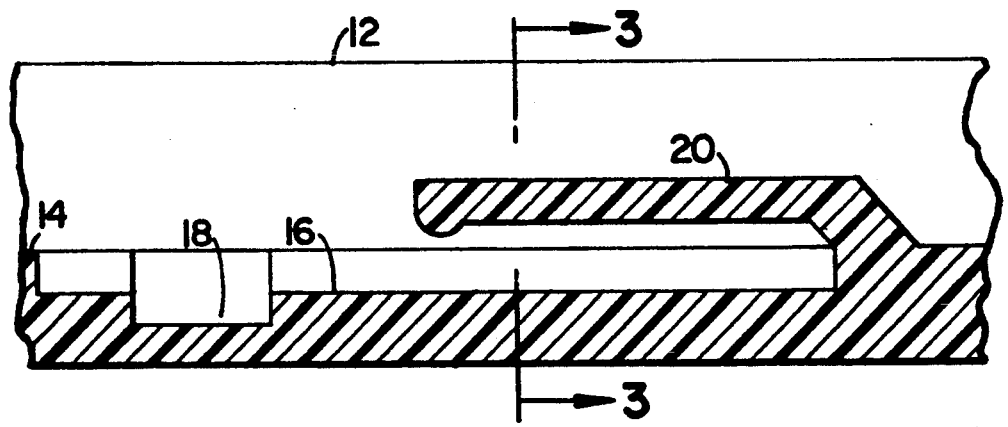
FIG. 2 is an enlarged partial view in cross-section of a preferred retaining clip according to the present invention.
Figure 3:
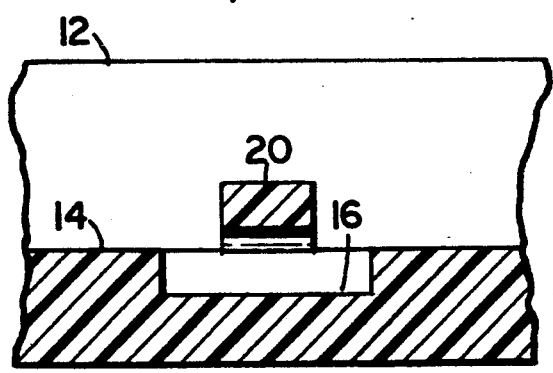
FIG. 3 is a partial view in cross-section of FIG. 2.

FIG. 2 depicts a cross-sectional view of the retaining clip 20 and a recess 16 according to the preferred embodiment depicted in FIGS. 1 and 1B of the present invention. As shown there, retaining clip 20 is disposed above the bottom surface of recess 16 to allow it to receive a test board 11. Surface 14 of the bottom wall of the container 10 lies above the bottom surface of recess 16 which prevents transverse movement of the test boards between adjacent clips 20.

It is preferred that retaining clip 20 is resiliently attached to tray 10 as well as being resilient along its length to allow for easy insertion and removal of test boards.

Also depicted in FIG. 2 is the channel 18 formed across a row of recesses 16 which provides tweezer access for removal of test boards from the tray 10 according to the present invention.

Figure 4:
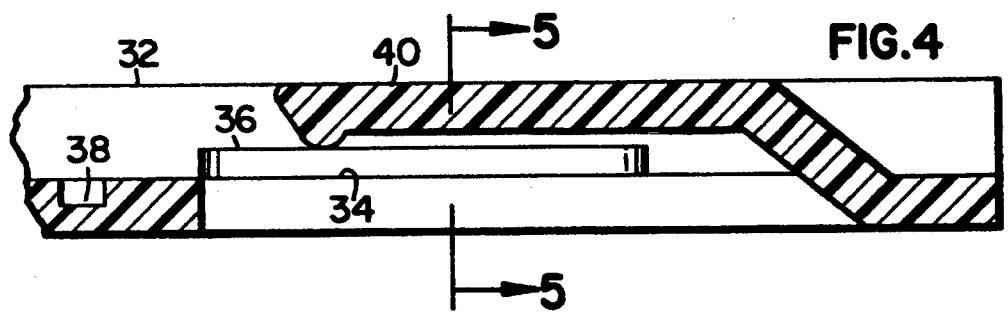
FIG. 4 is an enlarged partial view in cross-section of an alternate preferred embodiment of the test board according to the present invention.
Figure 5:
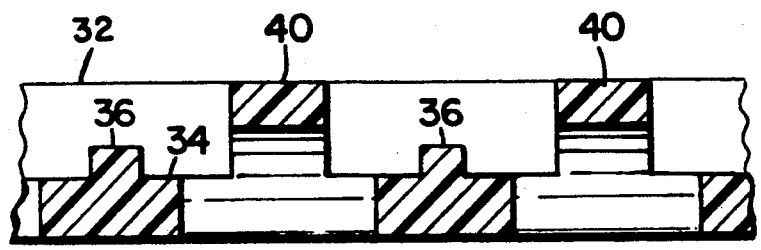
FIG. 5 is a partial view in cross-section of FIG. 4.

Turning now to FIGS. 4 and 5, wherein an alternate preferred embodiment of the retaining clip and tray designed according to the present invention is depicted. The retaining clip 40 is substantially similar to retaining clip 20 described above. The primary difference in the design of the tray depicted in FIGS. 4 and 5 lies in the raised partitions 36 rising from the bottom surface 34 of the tray depicted in FIGS. 4 and 5. Those raised partitions 36 serve the same purpose as the recess 16 described with respect to tray 10 above, i.e., they serve to prevent transverse movement of test boards between retaining clips 40.

Like tray 10, alternative embodiment tray 30 also includes a channel 38 formed across the rows of retaining clips to allow for tweezer access to remove test boards from the tray 30 of this embodiment.

It is preferred that trays manufactured according to the present invention be injection-molded of a plastic material so that the retaining clips and bottom surfaces of the trays form a completely integral unitary device. As such, the material chosen must provide retaining clips 20 or 40 which have sufficient resiliency to trap a test board against the bottom surface lying beneath that retaining clip.

It will be understood that the retaining clips and trays could, alternatively, be formed of a wide variety of materials including metal, fiberglass, composites, etc. Furthermore, it will also be understood that the parts of the container could be formed separately and joined by a variety of means well known to those skilled in the art.

It is also preferred that the tray material be conductive to minimize the possibility of damage due to the build-up of static electricity on the trays themselves. In addition, conductive trays will allow for convenient grounding of test boards if such a need arises.

FIG. 1 also depicts a test board 11 in position in one of the recesses 16 in tray 10. The test board 11 includes fine wire leads 13 soldered to its surface and lying in tray 10. As such, it will be recognized that, in the preferred embodiments, tray 10 should have sufficient space between rows of retaining clips 20 to provide room for the fine wire leads 13 to lay flat within the tray during transport and handling.

It will also be appreciated that trays 10 and 30 constructed according to the present invention can be stacked with similar trays during shipping and transport. As such, the bottom of each tray forms a cover for the tray beneath it.

Trays manufactured according to the present invention also preferably serve as the fixture used to hold test boards 11 while the fine wire leads 13 are soldered to them. As such, the trays 10 provide a multi-use device which reduces the amount of handling required during manufacturing of the test boards and fine wire leads.

After attachment of fine wire leads 13, the leads 13 are preferably covered by foam (not shown) to prevent movement of the leads 13 during shipping. The trays 10 are then stacked as described above.

It is to be understood that even though numerous characteristics and advantages of the present invention have been set forth in the foregoing description, together with details of the structure and function of preferred embodiments of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A combination of a test board and a container for packaging a plurality of planar test boards during transport and handling, comprising:

a tray having an outer wall and a substantially planar bottom surface, said outer wall and bottom surface at least partially defining a protected space therein;

a plurality of retaining clips integral with said tray, each of said plurality of retaining clips having first and second ends, said first ends each attached to said tray and said second ends each being resiliently suspended above said bottom surface; and a test board frictionally retained against said bottom surface and within said protected space by said second end of at least one of said plurality of retaining clips, said second end being suspended above said bottom surface by a distance less than a thickness of said test board, such that said test board must be slidingly inserted between said second end of said at least one of said retaining clips and said bottom surface, thereby raising said second end above said bottom surface to a distance equal to said thickness of said test board and said second end forcing said test board against said bottom surface.

2. The combination of claim 1, wherein said bottom surface further comprises means for preventing transverse movement of said test board within said protected space.

3. The combination of claim 2, wherein said means for preventing transverse movement further comprises a plurality of recesses formed in said bottom surface beneath each of said plurality of retaining clips, each of said recesses receiving at least one test board.

4. The combination of claim 2, wherein said means for preventing transverse movement further comprises a plurality of protrusions formed on said bottom surface between adjacent ones of said plurality of retaining clips.

5. The combination of claim 1, wherein said means for preventing transverse movement further comprises:

a plurality of recesses formed in said bottom surface, each of said plurality of recesses being located beneath each of said plurality of retaining clips; and a plurality of protrusions formed on said bottom surface, each of said protrusions being located between adjacent pairs of said plurality of recesses.

6. The combination of claim 1, further comprising means for removing said test board retained within said protected space by at least one of said plurality of retaining clips.

7. The combination of claim 6, wherein said test board removal means further comprises a depression formed in said bottom surface, said depression allowing insertion of a removal device between a test board and said tray.

8. A combination according to claim 1, wherein said tray is fabricated from an electrically conductive material, so that components in said tray may be grounded during transport and handling.

9. A combination according to claim 8, wherein said material is an electrically conductive plastic compound.

10. A combination according to claim 8, wherein said material is metallic.

11. A combination of a test board and a container for packaging a plurality of test boards during transport and handling, comprising:

a tray having an outer wall and a substantially planar bottom surface, said outer wall and bottom surface at least partially defining a protected space therein;

a plurality of retaining clips integral with said tray, each of said plurality of retaining clips having first and second ends, said first ends each attached to said troy and said second ends each being resiliently suspended above said bottom surface;

a test board frictionally retained against said bottom surface and within said protected space by said second end of at least one of said plurality of retaining clips, said second end being suspended above said bottom surface by a distance less than a thickness of said test board, such that said test board must be slidingly inserted between said second end of said at least one of said retaining clips and said bottom surface, thereby raising said second end above said bottom surface to a distance equal to said thickness of said test board and said second end forcing said test board against said bottom surface; and means for preventing transverse movement of said test board within said protected space comprising a plurality of protrusions formed on said bottom surface between adjacent ones of said plurality of retaining clips.

12. A method of packaging a plurality of test boards on a tray comprising the steps of:

(a) providing a container comprising a tray having an outer wall with a bottom surface which at least partially define a protected space therein, and a plurality of retaining clips integral with said tray, each of said plurality of retaining clips having first and second ends, said first ends each attached to said tray and said second ends each being resiliently suspended above said bottom surface by a distance less than a thickness of one of said plurality of test boards;

(b) placing each of said plurality of test boards in said protected space; and (c) sliding each of said plurality of test boards along said bottom surface to a position between said bottom surface and at least one of said second ends of said plurality of retaining clips; wherein each of said plurality of test boards is forced between said at least one of said plurality of retaining clips thereby raising said second end further above said bottom surface and further wherein each of said plurality of test boards is frictionally retained within said protected space.

* * * * *